US005637912A

United States Patent [19]
Cockerill et al.

[11] Patent Number: 5,637,912
[45] Date of Patent: Jun. 10, 1997

[54] THREE-DIMENSIONAL MONOLITHIC ELECTRONIC MODULE HAVING STACKED PLANAR ARRAYS OF INTEGRATED CIRCUIT CHIPS

[75] Inventors: Martha A. C. Cockerill; John G. Maltabes, both of Austin, Tex.; Loretta J. O'Connor, Westford; Steven H. Voldman, Burlington, both of Vt.

[73] Assignee: International Business Machines Corporation, Armonk, N.Y.

[21] Appl. No.: 653,752

[22] Filed: May 31, 1996

Related U.S. Application Data

[63] Continuation of Ser. No. 293,991, Aug. 22, 1994, abandoned.

[51] Int. Cl.$^6$ .................................................. H01L 27/00
[52] U.S. Cl. .......................... 257/620; 257/690; 257/723
[58] Field of Search .................................... 257/620, 723, 257/724, 690, 698, 202, 734

[56] References Cited

U.S. PATENT DOCUMENTS

| 4,398,248 | 8/1983 | Hsia et al. | 364/200 |
|---|---|---|---|
| 4,646,128 | 2/1987 | Carson et al. | 357/74 |
| 4,770,640 | 9/1988 | Walter | 439/69 |
| 4,801,992 | 1/1989 | Golubic | 357/40 |
| 4,897,708 | 1/1990 | Clements | 257/690 |
| 4,965,653 | 10/1990 | Otsuka et al. | 257/690 |
| 4,983,533 | 1/1991 | Go | 437/7 |
| 5,025,306 | 6/1991 | Johnson et al. | 357/75 |
| 5,075,253 | 12/1991 | Sliwa, Jr. | 257/723 |
| 5,214,657 | 5/1993 | Farnworth et al. | 257/202 |
| 5,266,833 | 11/1993 | Capps | 257/690 |

*Primary Examiner*—Peter Toby Brown
*Attorney, Agent, or Firm*—Heslin & Rothenberg, P.C.

[57] ABSTRACT

A fabrication method and resultant monolithic electronic module comprising a plurality of stacked planar extending arrays of integrated circuit chips. The fabrication method includes dicing a wafer of integrated circuit chips into a plurality of arrays of integrated circuit chips. The arrays of integrated circuit chips are then stacked to form an electronic module. A metallization pattern may be deposited on a substantially planar surface of the electronic module, and used to interconnect the various arrays of integrated circuit chips contained therein. Specific details of the fabrication method and resultant multi-chip package are set forth.

12 Claims, 4 Drawing Sheets

THREE-DIMENSIONAL MONOLITHIC ELECTRONIC MODULE HAVING STACKED PLANAR ARRAYS OF INTEGRATED CIRCUIT CHIPS

This application is a continuation, of application Ser. No. 08/293,991, filed Aug. 22, 1994, now abandoned.

TECHNICAL FIELD

The present invention relates in general to high density electronic packaging which permits optimization of the number of circuit elements to be included in a given volume. More particularly, this invention relates to a technique for forming a monolithic electronic module by stacking arrays of integrated circuit chips. The resulting electronic module may be used as a single high density electronic module, or be subdivided into multiple electronic modules.

BACKGROUND ART

Since the development of integrated circuit technology, computers and computer storage devices have been made from wafers of semiconductor material comprising a plurality of integrated circuits. After a wafer is made, the circuits are typically separated from each other by dicing the wafer into individual chips. Thereafter, the individual chips are bonded to carriers of various types, interconnected by wires and packaged. Such "two dimensional" packages of chips fail to optimize the number of circuits that may be fabricated in a given space, and also introduce undesirable signal delays, capacitance, and inductance as signals travel between chips. Recently, three-dimensional stacks of single chips have emerged as an important packaging approach. A typical multi-chip electronic module consists of multiple individual integrated circuit chips adhesively secured together as a monolithic structure (a "stack") extending in one direction as a single row or column. A metallization pattern is often provided directly on one (or more) side surface(s) of the module for chip interconnection and for electrical connection of chips to circuitry external to the module. Metallization patterns can include both individual contacts, and bussed contacts.

Volume production of electronic modules formed of stacks of individual integrated circuit chips has been limited by the high production costs associated therewith. The individual steps of dicing, stacking, and applying metallization are all relatively complex and expensive process steps in the formation of a monolithic electronic module. Furthermore, the overall level of circuit integration and density in an electronic module is necessarily limited in a stack of single integrated circuit chips extending in one-direction as a row or column.

DISCLOSURE OF THE INVENTION

Briefly described, the present invention comprises, in a first aspect, a novel process for forming an electronic module. The process includes providing a plurality of planar arrays, each planar array comprising multiple integrated circuit (IC) chips. A planar array is a single, substantially planar substrate with multiple IC chips disposed thereon and organized in a grid like (an array) manner. Next, the planar arrays are stacked to form an electronic module. As an enhancement, the planar arrays may be aligned such that the edge surfaces of the planar arrays at least partially define a side surface of the electronic module. As a further enhancement, a metallization pattern may be deposited on the substantially planar side surface of the electronic module, and used to at least partially electrically interconnect the planar arrays.

In another aspect, the present invention consists of an electronic module comprising a plurality of stacked planar arrays, each planar array having multiple IC chips. As one enhancement, each planar array has an edge surface, and these edge surfaces at least partially define a side surface of the electronic module. A metallization pattern is deposited on the side surface of the module, at least partially electrically interconnecting the planar arrays. In a further enhancement, each planar array has transfer metals extending to an edge surface. These transfer metals at least partially electrically attach to the metallization pattern.

In yet another aspect of the present invention, a method for forming a planar array for use in an electronic module (having a plurality of planar arrays) is disclosed. A wafer is provided having a plurality of IC chips. The wafer is then diced to form at least two planar arrays, each planar array having a plurality of IC chips. As an enhancement, before dicing the wafer, a dicing pattern may be determined, the dicing being performed according to the dicing pattern. The dicing pattern may be optimized in order to maximize a yield of planar arrays from the wafer.

The present invention provides many advantages over existing technology. By forming electronic modules from planar arrays of IC chips, a higher level of integration is achieved over traditional single chip stacking technology.

Creating electronic modules out of planar arrays of multiple integrated circuit chips yields larger electronic modules than those based upon single chips. These larger modules have superior characteristics with respect to handling, processing, packaging and density. Thus, associated processes are simpler and less expensive. Furthermore, because a wafer is diced into planar arrays of multiple integrated circuit chips, the amount of wafer level dicing has been reduced, thereby simplifying overall wafer processing.

In the embodiment of the present invention in which an electronic module is fabricated and then subdivided into smaller electronic modules, the smaller electronic modules have been fabricated sharing common dicing, stacking and interconnecting (side surface metallization) processes. Thus, the overall fabrication complexity and costs associated with the resultant smaller electronic modules have been reduced as contrasted with individual fabrication.

BRIEF DESCRIPTION OF THE DRAWINGS

The subject matter which is regarded as the present invention is particularly pointed out and distinctly claimed in the concluding portion of the specification. The invention, however, both as to organization and method of practice, together with further objects and advantages thereof, may best be understood by reference to the following detailed description taken in conjunction with the accompanying drawings in which:

BEST MODE FOR CARRYING OUT THE INVENTION

Figure 1:
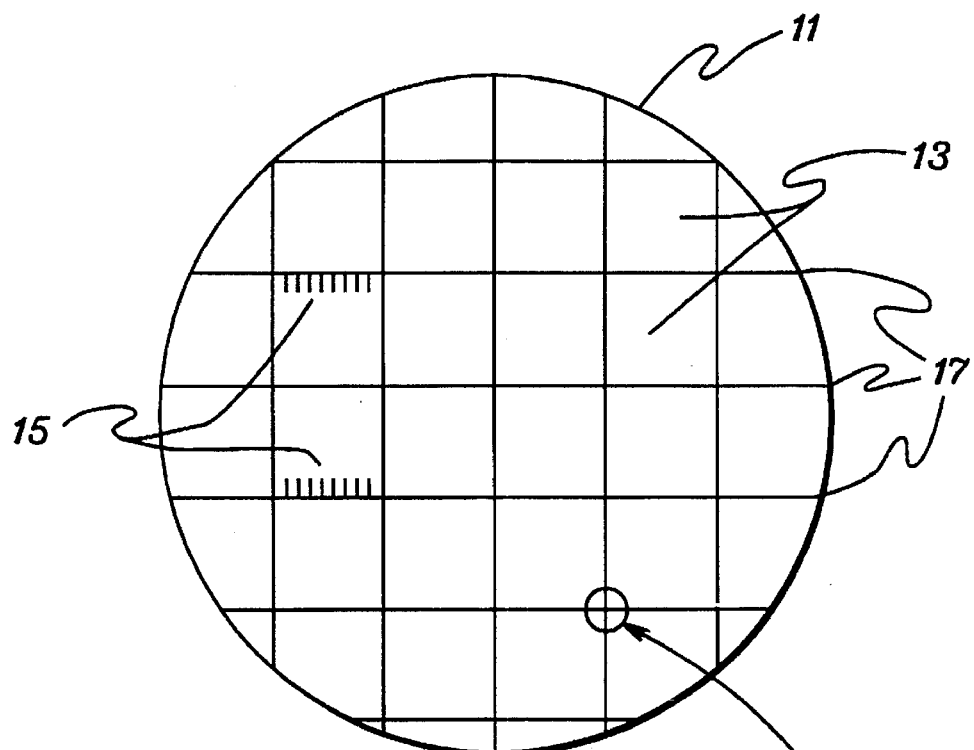
FIG. 1 is a top view of a wafer comprising a plurality of integrated circuit chips.

Certain preferred embodiments for forming an electronic module are presented herein. FIG. 1 is a top view of wafer 11 consisting of multiple integrated circuit (IC) chips 13 which are used in the formation of planar arrays of IC chips. A planar array of IC chips is a single, substantially planar substrate containing multiple IC chips organized in a grid like (an array) manner. These planar arrays are then used in forming the electronic module of the present invention. Typical functions implemented by the integrated circuit chips may include, for example, memory, interface, processor and/or control functions. Each chip may include any function known in the art for implementation on a semiconductor chip. Fabrication of the wafer is performed by conventional techniques known in the art.

In accordance with the present invention, the wafer is first tested to determine which of the plurality of integrated circuit chips are functional. This step is necessary because some chips may exhibit defects, and their inclusion in the resulting electronic module of the present invention may be undesirable. In this regard, a "functional map" indicating functional and non-functional chips within the wafer is produced. This map is then utilized, together with information regarding the dimensions of the planar arrays of IC chips required (see, for example, the 1×4 array of FIG. 2), to produce a "dicing pattern" which indicates how the wafer is to be cut into individual planar arrays of IC chips.

Various manual and/or computer controlled methods may be used to determine a dicing pattern. As a particular process example, if a 1×4 (one chip by four chips) planar array is needed, contiguous linear groups of 4 functional chips are identified. Each group is then designated as part of the dicing pattern. It should be generally noted that each array within the wafer should be oriented in the same direction. That is, no two arrays should be positioned in a perpendicular direction to each other on the wafer. This is necessary to simplify the later process step of applying a transfer metallurgy layer to the wafer.

As an enhancement, an optimizing algorithm (i.e., clustering algorithm) may be used in reorganizing the dicing pattern to optimize the total yield of (e.g., 1–4) arrays from the wafer. For example, the algorithm could automatically calculate the preferred orientation of planar arrays on the wafer.

Continuing with the description of a preferred embodiment, once a "dicing pattern" is determined, locating each array on the wafer, appropriate transfer metallurgy (i.e. "transfer metals") (15) may be deposited on the wafer using conventional techniques. The transfer metals provide electrical connections from input/output pads (not shown) on the surface of each chip to an edge of the chip. The transfer metallurgy pattern is designed in conjunction with the dicing pattern so that the edges of the chips to which the transfer metals extend corresponds to an edge of the planar array containing the chips. Ultimately, this provides electrical connectivity from the side surface of a resulting electronic module (defined by the edge surfaces of the individual stacked planar arrays) to individual chips within the module.

Figure 1A:
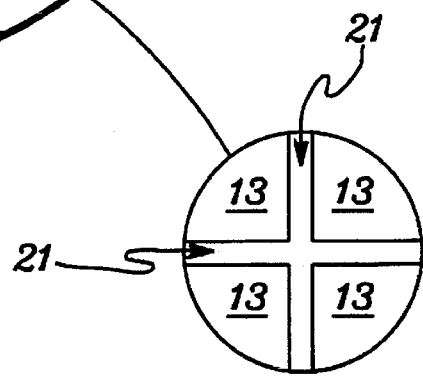
FIG. 1a is an enlarged plan view of a portion of the wafer of FIG. 1.
Figure 2:
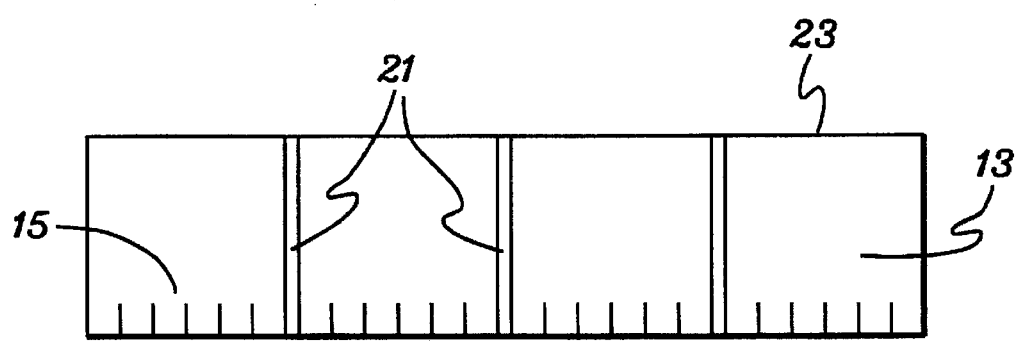
FIG. 2 is a top view of an array of integrated circuit chips formed by dicing the wafer of FIG. 1.

The wafer may then be diced according to the established dicing pattern along horizontal kerfs comprising part of kerf region 21 (FIG. 1a) separating the chips, 17 so as to form planar arrays of IC chips (kerfs are the spaces between individual chips in a wafer). As a specific example, as shown in FIG. 2, linear array of IC chips 23 has been formed by dicing a wafer (11) into a 1×4 planar array of IC chips (13). Because the array is formed from a single wafer, it comprises a single, substantially planar piece of substrate (for example, silicon) with four IC chips formed thereon. Each IC chip includes transfer metals 15 extending towards an edge surface of the chip (hence, the edge of the array) for connection to external circuitry. The chip (13) are separated within the array by kerf region 21.

Figure 3:
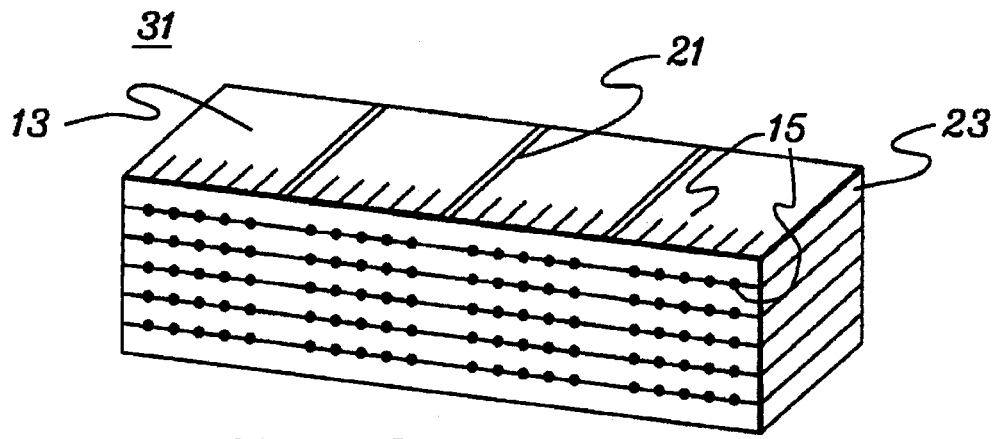
FIG. 3 is a perspective view of an electronic module of the present invention formed by stacking a plurality of arrays of integrated circuit chips of FIG. 2.

To proceed, in the preferred embodiment of the present invention, as shown in FIG. 3, a plurality of planar arrays of integrated circuit chips are stacked to form electronic module 31 (without side surface metallization). The stacking process may be performed in a manner similar to the forming of "single chip" based electronic modules. Planar arrays of IC chips generally have their active circuit layers protected by an insulator (not shown) that contains appropriate transfer metals. An adhesive (not shown) is applied to the surface of the insulator, and used to adjoin one array of integrated circuit chips to the back surface of the next array. Each array is thus bonded to an adjacent array forming a monolithic electronic module.

During the "stacking" process, the arrays are aligned such that the resultant electronic module has a substantially rectangular parallelepiped shape. This results in columnar alignment of IC chips (13) within adjacent arrays of the electronic module. Further, alignment of the edge surfaces of the arrays is achieved. Accordingly, a substantially planar side surface of the electronic module is defined by the plurality of edge surfaces.

In a further process step of the present invention, the substantially planar side surface of the module is etched and polished to expose the ends of the transfer metals (15). These transfer metals may be utilized to interconnect the various arrays, and/or connect the module to external circuitry.

Figure 4:
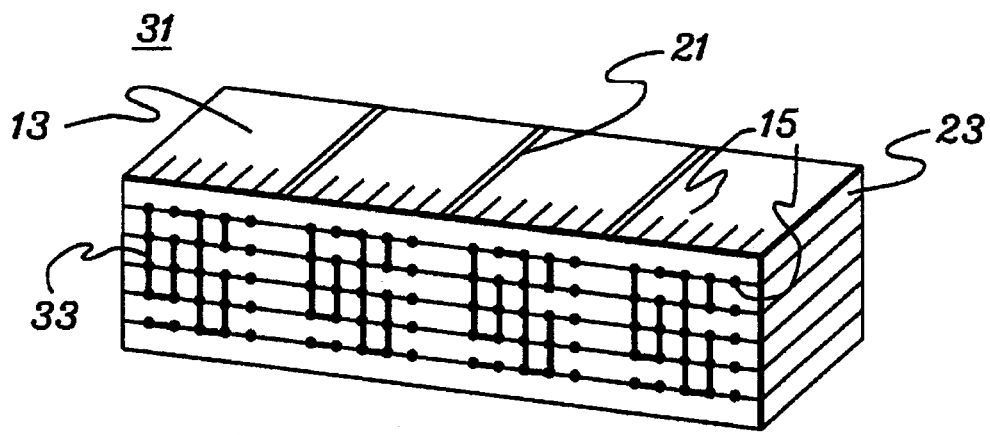
FIGS. 4–5 are perspective views of an electronic module with side surface metallization according to the present invention.
Figure 5:
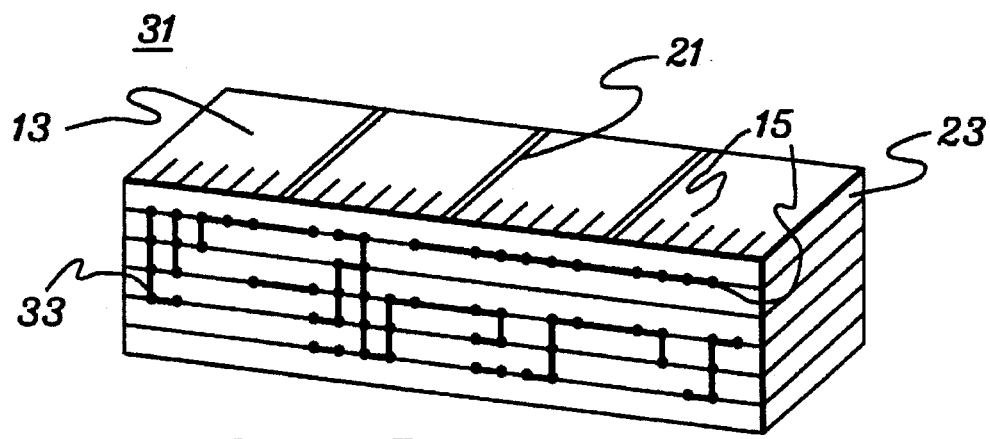

FIGS. 4 and 5 depict embodiments of the present invention in which side surface metallization 33 has been formed to interconnect the various chips contained in, and facilitate external electrical connection of, the module. In FIG. 4, each individual "chip column" composed of aligned IC chips in adjacent layers is treated as a separate electronic module. As shown, the side surface metallization contains the same interconnect pattern on each "chip column." This enables the electronic module, if separated along the kerfs between chips to form multiple "chip column" electronic nodules with associated side surface metallization. Advantageously, each of the "chip column" modules is formed by a common dicing, stacking, and metallization process, thereby reducing overall costs.

As an enhancement, the electronic module of FIG. 4 may be divided into other variously dimensioned smaller electronic modules. For example, instead of dividing the electronic module into foul "chip columns" as above, a 1×4 module could be divided into a 1×1 and a 1×3 module. Alternately, it could be divided into two 1×2 modules. The side metallization pattern applied would be tailored to the smaller modules formed. For example, if two 1×2 modules were to be formed from a 1×4 module, each 1×2 module would be identically and individually interconnected by the side metallization pattern applied to the 1×4 module.

In the embodiment of the present invention shown in FIG. 5, a side surface metallization is deposited interconnecting the entire "stack" of arrays as a single, very high density monolithic electronic module. There is no distinction of "chip columns" as described hereinabove. Signals from any IC chip within the module may be interconnected to signals from any other IC chip. This provides a gainful advantage in overall electronic module complexity and density.

In an alternative embodiment of the present invention, the dicing pattern may be purposefully designed to include non-working chips in the arrays. Non-working chips are included to optimize the yield of arrays from a given wafer. In that case, the functional map of the wafer is used to determine the functional/non-functional chips in each array (diced from the wafer). This information is then used when electrically interconnecting the chips in the array so as to functionally exclude non-working chips from the resultant electronic module.

Specifically, provisions are necessary to functionally remove the non-working chips from the encompassing electronic module. Accordingly, a side surface metallization pattern may be tailored to route signals away from non-working chips. Furthermore, if spare chips are included within the module, then the side surface metallization pattern may electrically (and functionally) replace the non-working chips with spares. Thus, a wafer may be more fully utilized in forming planar arrays by including non-working chips in the arrays, and electrically replacing (or excluding) the non-working chips at the module level. This technique circumvents restricting the dicing pattern so as to avoid including failed chips in the arrays, lowering the overall yield of arrays from the wafer.

In an alternate embodiment of the present invention, other dimensions of arrays of integrated circuit chips are possible (not shown). For example, the array could be two chips wide and four chips long (2×4), or the array could be one chip wide and eight chips long (1×8). Essentially, any combination of array dimensions is possible.

In yet another embodiment of the present invention (not shown), metallization may be deposited on additional side faces (or end surfaces) of the electronic module. Each of these metallization patterns permits more complex interconnection among the chips of the electronic module. However, the additional process steps necessary to form such metallization adds costs. In particular, if additional (for example, a second) side surface metallization is used, the transfer metallurgy pattern on each array becomes more complex because it must connect to two array edges (corresponding to two side surfaces), as well as the I/O pads on the surfaces of the chips comprising the array. Nonetheless, a module formed with additional interconnection is more complex, more powerful, and simpler to interface with external circuitry.

Figure 7:
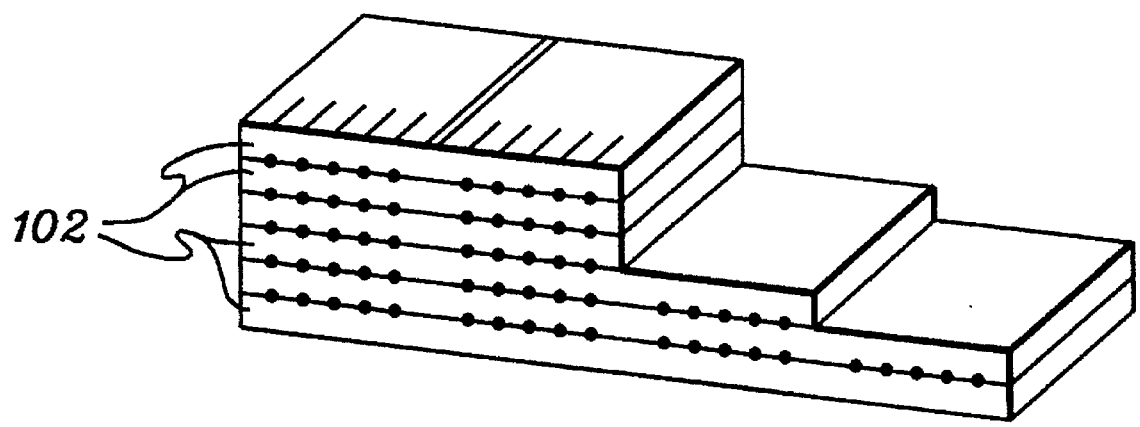
FIG. 7 is a perspective view of an alternate embodiment of an electronic module in accordance with the present invention.

In an alternate embodiment of the present invention, the size of the individual planar arrays within a module may be different. For example, in a module comprising mostly 1×4 arrays, an end array could be a 1×3 array. As another example, half of a "stack" could comprise 2×8 arrays and the other half 1×8 arrays. Added variety in the scope of useful modules is thus achieved. FIG. 7 depicts an example of an electronic module, generally denoted 100, wherein the rectangular arrays 102 comprising the module have different quantities of integrated circuit chips contained therein.

Figure 6:
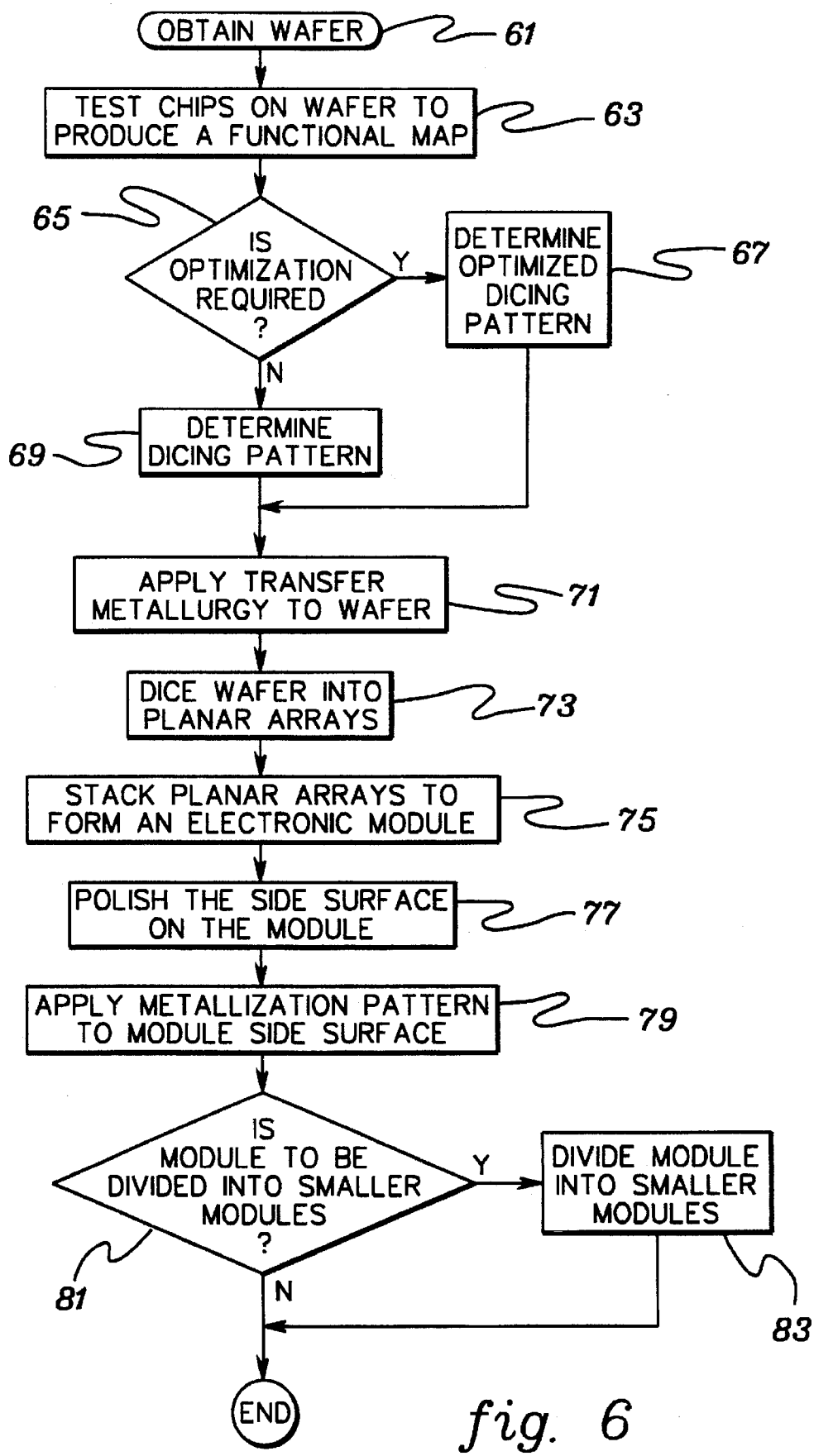
FIG. 6 is a flow chart of a preferred method for forming the electronic module of the present invention.

To summarize, the flow chart of FIG. 6 depicts a preferred method for forming the electronic module of the present invention. The method begins with the obtaining of a wafer (61) containing a plurality of IC chips. The chips on the wafer are then tested and a "functional map" is produced (63). Next, the wafer must next be diced in order to form planar arrays of IC chips, however, before dicing is performed, a dicing pattern must be determined. Based upon the size of the arrays as well as the functional map, a dicing pattern is established. If the total number of arrays obtainable from the wafer is desired to be optimized (65) then a manual or computer driven process may be used to determine an optimized dicing pattern (67). Otherwise, a dicing pattern is easily determined by looking for functional appropriately sized arrays of IC chips on the wafer (69).

Prior to actual dicing, transfer metallurgy is applied to the various IC chips on the wafer (71), however, this transfer metallurgy will be tailored to the dicing pattern determined. The transfer metallurgy generally extends towards an edge of each individual chip corresponding to an edge of the array. However, transfer metallurgy may be provided that extends to multiple array edges, in multiple directions, to facilitate additional interconnection. After the transfer metallurgy had been applied, the wafers are ready for dicing into planar arrays of IC chips, and are accordingly diced (73). Thus, a plurality of planar arrays, each comprising a plurality of IC chips have been formed.

An electronic module may now be assembled by stacking the planar arrays (75). A substantially planar surface of each array is adhesively secured to a substantially planar main surface of an adjacent array. Each array is thus substantially parallel to the next forming a substantially rectangular parallelepiped shaped electronic module.

Next, a side surface of the electronic module to which the transfer metals extend towards is polished (77) exposing the ends of the transfer metals. A metallization pattern is then applied (79) to the side surface, and electrically connected to the transfer metals. This metallization pattern provides interconnection between the IC chips of the planar arrays of the electronic module. As an optional process step, the electronic module may be further subdivided into smaller electronic modules (81). If subdivision is required, the modules are divided (83) into smaller modules along the kerf region between chips.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

We claim:

1. A monolithic electronic module comprising:

a plurality of rectangular planar arrays, each rectangular planar array having a plurality of integrated circuit (IC) chips defined in a common substrate, with adjacent IC chips within said substrate separated by a region definitive of chip boundaries, at least some IC chips of each rectangular planar array having transfer metals extending to a common edge of the rectangular planar array, said plurality of rectangular planar arrays being stacked to form said monolithic electronic module, at least some rectangular planar arrays of said plurality of rectangular planar arrays each having at least one planar main surface physically contacting across an adhesive a planar main surface of an adjacent rectangular planar array such that said monolithic electronic module is parallelepiped, with the common edges of the rectangular planar arrays aligned to form a side surface of the monolithic electronic module, where the side surface comprises a polished side surface and the monolithic electronic module further comprises a metallization pattern over the polished side surface, said metallization pattern being electrically connected to the transfer metals of the at least some IC chips of each rectangular planar array.

2. The electronic module of claim 1, wherein each planar array of said plurality of planar arrays further comprises a first IC chip and a second IC chip, and wherein each planar array has a region definitive of chip boundaries disposed between said first IC chip and said second IC chip for facilitating separation of said first IC chip and said second IC chip.

3. The monolithic electronic module of claim 1, wherein each rectangular planar array has a first dimension and a second dimension, said second dimension being perpendicular to said first dimension, and wherein each rectangular planar array extends in said first dimension X chip lengths, wherein X≧1 chip length, and each rectangular planar array extends in said second dimension Y chip lengths, wherein Y chip lengths>X chip lengths.

4. The electronic module of claim 1, wherein said plurality of planar arrays are aligned such that each IC chip of said plurality of IC chips of each planar array is aligned with an IC chip of said plurality of IC chips of an adjacent planar array in the electronic module.

5. The monolithic electronic module of claim 4, further comprising a first IC chip in a first rectangular planar array of said plurality of rectangular planar arrays and a second IC chip from a second rectangular planar array of said plurality of rectangular planar arrays, and wherein said first IC chip and said second IC chip are columnarly aligned to at least partially form one of said chip columns, said metallization pattern individually interconnecting said first IC chip and said second IC chip of said one chip column.

6. A monolithic electronic module comprising a plurality of rectangular planar arrays, each rectangular planar array having a plurality of integrated circuit (IC) chips defined in a common substrate, with adjacent IC chips within said substrate separated by a region definitive of chip boundaries, at least some IC chips of each rectangular planar array having transfer metals extending to a common edge of the rectangular planar array, said plurality of rectangular planar arrays being stacked to form said monolithic electronic module, at least some rectangular planar arrays of said plurality of rectangular planar arrays each having at least one planar main surface parallel to and adhesively secured to a planar main surface of an adjacent rectangular planar array, with the common edges of the rectangular planar arrays aligned to form a side surface of the monolithic electronic module, wherein the side surface comprises a polished side surface and the monolithic electronic module further comprises a metallization pattern over the polished side surface, the metallization pattern being electrically connected to the transfer metals of the at least some IC chips of each rectangular planar array, wherein a first planar array of said plurality of planar arrays has a first quantity of IC chips and a second planar array of said plurality of planar arrays has a second quantity of IC chips, and wherein said first quantity of IC chips is different from said second quantity of IC chips.

7. A monolithic electronic module comprising:
a plurality of non-square rectangular planar arrays, each non-square rectangular planar array having a plurality of integrated circuit (IC) chips defined in a common substrate, with adjacent IC chips within said substrate separated by a region definitive of chip boundaries, at least some IC chips of each non-square rectangular planar array having transfer metals extending to a common edge of the non-square rectangular planar arrays, said plurality of non-square rectangular planar arrays being stacked to form said monolithic electronic module, each non-square rectangular planar array of said plurality of non-square rectangular planar arrays having at least one planar main surface disposed parallel to and adhesively secured to a planar main surface of an adjacent non-square rectangular planar array such that said monolithic electronic module is non-cubical and parallelepiped, with the common edges of the non-square rectangular planar arrays aligned to form a side surface of the monolithic electronic module, wherein the side surface comprises a polished side surface and the monolithic electronic module further comprises a metallization pattern over the polished side surface, said metallization pattern being electrically connected to the transfer metals of the at least some IC chips of each non-square rectangular planar array.

8. The monolithic electronic module of claim 7, wherein each non-square rectangular planar array of said plurality of non-square rectangular planar arrays comprises a linear array wherein the plurality of integrated circuit chips are disposed in a row, and wherein integrated circuit chips of different non-square rectangular planar arrays of the plurality of non-square rectangular planar arrays are aligned in chip columns that are oriented transverse the rows within which the plurality of integrated circuit chips of each non-square rectangular planar array are disposed.

9. The monolithic electronic module of claim 7, wherein each non-square rectangular planar array has a first dimension and a second dimension, said second dimension being perpendicular to said first dimension, and wherein each non-square rectangular planar array extends in said first dimension X chip lengths, wherein X≧1 chip length, and each non-square rectangular planar array extends in said second dimension Y chip lengths, wherein Y chip lengths>X chip lengths.

10. The monolithic electronic module of claim 7, wherein said plurality of non-square rectangular planar arrays are aligned such that each IC chip of said plurality of IC chips of each non-square rectangular planar array is aligned with an IC chip of said plurality of IC chips of an adjacent non-square rectangular planar array in the monolithic electronic module, thereby defining chip columns within the monolithic electronic module.

11. The monolithic electronic module of claim 10, further comprising a first IC chip in a first non-square rectangular planar array of said plurality of non-square rectangular planar arrays and a second IC chip from a second non-square rectangular planar array of said plurality of non-square rectangular planar arrays, and wherein said first IC chip and said second IC chip are columnarly aligned to at least partially form one of said chip columns, said metallization pattern individually interconnecting said first IC chip and said second IC chip of said one chip column.

12. A monolithic electronic module comprising a plurality of non-square rectangular planar arrays, each non-square rectangular planar array having a plurality of integrated circuit (IC) chips defined in a common substrate, with adjacent IC chips within said substrate separated by a region definitive of chip boundaries, at least some IC chips of each non-square rectangular planar array having transfer metals extending to a common edge of the non-square rectangular planar array, said plurality of non-square rectangular planar arrays being stacked to form said monolithic electronic module, each non-square rectangular planar array of said plurality of non-square rectangular planar arrays having at least one planar main surface disposed parallel to and adhesively secured to a planar main surface of an adjacent non-square rectangular planar array, with the common edges of the non-square rectangular planar arrays aligned to form a side surface of the monolithic electronic module, wherein the side surface comprises a polished side surface and the monolithic electronic module further comprises a metallization pattern over the polished side surface, said metallization pattern being electrically connected to the transfer metals of the at least some IC chips of each non-square rectangular planar array, wherein a first non-square rectangular planar array of said plurality of non-square rectangular planar arrays has a first quantity of IC chips and a second non-square rectangular planar array of said plurality of non-square rectangular planar arrays has a second quantity of IC chips, and wherein said first quantity of IC chips is different from said second quantity of IC chips.

* * * * *

UNITED STATES PATENT AND TRADEMARK OFFICE
CERTIFICATE OF CORRECTION

PATENT NO.   : 5,637,912
DATED        : Jun. 10, 1997
INVENTOR(S)  : Cockerill et al.

It is certified that error appears in the above-identified patent and that said Letters Patent is hereby corrected as shown below:

Column 3, line 67 - Column 4, line 1,   "horizontal kerfs comprising part of kerf region 21 (FIG. 1a) separating the chips, 17" should read --horizontal kerfs 17 comprising part of kerf region 21 (FIG. 1a) separating the chips,--.

Signed and Sealed this

Twenty-third Day of December, 1997

Attest:

BRUCE LEHMAN

Attesting Officer

Commissioner of Patents and Trademarks